US009778862B2

(12) United States Patent
Yeh

(10) Patent No.: US 9,778,862 B2
(45) Date of Patent: Oct. 3, 2017

(54) DATA STORING METHOD FOR PREVENTING DATA LOSING DURING FLUSH OPERATION, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHILSON ELECTRONICS CORP., Miaoli (TW)

( * ) Notice: Subject to any disclaimer, the term of this patent is extended or adjusted under 35 U.S.C. 154(b) by 125 days.

(21) Appl. No.: 14/195,871

(22) Filed: Mar. 4, 2014

(65) Prior Publication Data

US 2015/0186058 A1    Jul. 2, 2015

(30) Foreign Application Priority Data

Dec. 30, 2013  (TW) .............................. 102149043 A

(51) Int. Cl.
   *G06F 3/06* (2006.01)
   *G06F 12/02* (2006.01)
   *G11C 11/56* (2006.01)

(52) U.S. Cl.
   CPC .......... *G06F 3/0619* (2013.01); *G06F 3/0656* (2013.01); *G06F 3/0679* (2013.01); *G06F 12/02* (2013.01); *G11C 11/5628* (2013.01)

(58) Field of Classification Search
   None
   See application file for complete search history.

(56) References Cited

U.S. PATENT DOCUMENTS

2010/0042773 A1* 2/2010 Yeh .............................. 711/103
2014/0013031 A1* 1/2014 Masuo et al. ................. 711/103

* cited by examiner

*Primary Examiner* — Daniel Tsui
*Assistant Examiner* — Edward Wang
(74) *Attorney, Agent, or Firm* — Jianq Chyun IP Office

(57) ABSTRACT

A data storing method for storing data in a rewritable non-volatile memory module is provided. The method includes temporarily storing first data into a buffer memory; and starting a flush operation to write the first data from the buffer memory into a first physical programming unit. The method further includes determining whether the first physical programming unit is a lower physical programming unit; and if yes, writing second data into a second physical programming unit, wherein the second physical programming unit belongs to an upper physical programming unit, and the second physical programming unit and the first physical programming unit are formed by the same memory cells disposed on the same word line. Accordingly, the method can effectively prevent the data written during the flush operation from losing due to the programming fail occurred on other physical programming units.

21 Claims, 12 Drawing Sheets

802   804

| logical page | physical programming units |
|---|---|
| LBA(0) | NULL |
| LBA(1) | NULL |
| LBA(2) | NULL |
| ⋮ | ⋮ |
| LBA(H) | NULL |

800

FIG. 8 lower physical programming units | upper physical programming units

| PBA(0-0) | PBA(0-2) | W(0) |
| PBA(0-1) | PBA(0-4) | W(1) |
| PBA(0-3) | PBA(0-6) | W(2) |
| PBA(0-5) | PBA(0-8) | W(3) |
| ⋮ | ⋮ | ⋮ |
| PBA(0-(K-4)) | PBA(0-(K-1)) | W(L-1) |
| PBA(0-(K-2)) | PBA(0-K) | W(L) |

DATA STORING METHOD FOR PREVENTING DATA LOSING DURING FLUSH OPERATION, MEMORY CONTROL CIRCUIT UNIT AND MEMORY STORAGE APPARATUS

CROSS-REFERENCE TO RELATED APPLICATION

This application claims the priority benefit of Taiwan application serial no. 102149043, filed on Dec. 30, 2013. The entirety of the above-mentioned patent application is hereby incorporated by reference herein and made a part of this specification.

BACKGROUND

Technical Field

The present invention relates to a data storing method for a rewritable non-volatile memory module, and a memory control circuit unit and a memory storage apparatus using the same.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a storage apparatus which utilizes a flash memory as its storage medium. For these reasons, the flash memory has become an important part of the electronic industries.

Based on memorable bits of each memory cell, a NAND-type flash memory may be divided into a Single Level Cell (SLC) NAND-type flash memory and a Multi Level Cell (MLC) NAND-type flash memory. Therein, each memory cell of the SLC NAND flash memory is capable of storing one bit of data (i.e., "1" and "0"), and each memory cell of the MLC NAND flash memory is capable of storing two bits of data.

In the NAND-type flash memory, physical pages are formed by a plurality of memory cells arranged in the same word line. Because each memory cell of the SLC NAND flash memory is capable of storing one bit of data, the memory cells arranged on the same word line is corresponding to one physical page in the SLC NAND flash memory.

In comparison with the SLC NAND flash memory, a floating gate storage layer of each memory cell of the MLC NAND flash memory is capable of storing two bits of data. Therein, each storage status (i.e., "11", "10", "01" and "00") includes a Least Significant Bit (LSB) and a Most Significant Bit (MSB). For instance, in the storage status, a value of a first bit counted from the left is the LSB, and a value of a second bit counted from the left is the MSB. Therefore, the memory cells arranged in the same word line can constitute two physical pages. The physical page constituted by the LSBs of said memory cells are referred to as a low physical page, and the physical page constituted by the MSBs of said memory cells are referred to as an upper physical page. Particularly, a writing speed of the low physical page is faster than a writing speed of the upper physical page, and data stored in the low physical page may be lost due to programming fail occurred on the upper physical page.

Particularly, after a flush operation is executed to write data into a buffer memory of a memory storage apparatus to a flash memory module, the data in the buffer memory is erased. Thereafter, in case the data stored in the low physical page is lost due to programming fail occurred on the upper physical page, because the data in the buffer memory is already erased, the data cannot be recovered, such that reliability of the memory storage apparatus may be seriously affected.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data storing method, a memory control circuit unit and a memory storage apparatus, capable of effectively preventing the data written in the rewritable non-volatile memory module during the flush operation from losing due to the programming fail occurred on the other physical programming units.

A data storing method for storing data in a rewritable non-volatile memory module is provided according to an exemplary embodiment of the present invention. The rewritable non-volatile memory module has a plurality of physical erasing units, and each of the physical erasing units has a plurality of physical programming units including a plurality of lower physical programming units and a plurality of upper physical programming units. The data storing method includes: temporarily storing first data into a buffer memory; and starting a flush operation to write the first data from the buffer memory into a first physical programming unit of a first physical erasing unit. The data storing method further includes: after writing the first data into the first physical programming unit of the first physical erasing unit, determining whether the first physical programming unit of the first physical erasing unit is one of the lower physical programming units. The data storing method further includes: if the first physical programming unit of the first physical erasing unit is one of the lower physical programming units, writing second data into a second physical programming unit of the first physical erasing unit, wherein the second physical programming unit of the first physical erasing unit belongs to one of the upper physical programming units, and the second physical programming unit of the first physical erasing unit and the first physical programming unit of the first physical erasing unit are formed by a plurality of memory cells disposed on a first word line.

A memory control circuit unit for controlling a rewritable non-volatile memory module is provided according to an exemplary embodiment of the present invention. The memory control circuit unit includes a host interface, a memory interface and a memory management circuit. The host interface is configured to couple to a host system. The memory interface is configured to couple to the rewritable non-volatile memory module. The rewritable non-volatile memory module has a plurality of physical erasing units, and each of the physical erasing units has a plurality of physical programming units including a plurality of lower physical programming units and a plurality of upper physical programming units. The memory management circuit is coupled to the host interface and the memory interface, and configured to temporarily store first data into a buffer memory. In addition, the memory management circuit is further configured to start a flush operation to write the first data from the buffer memory into a first physical programming unit of a first physical erasing unit. In addition, after writing the first data into the first physical programming unit of the first physical erasing unit, the memory management circuit is further configured to determine whether the first physical programming unit of the first physical erasing unit is one of the lower physical programming units. If the first physical programming unit of the first physical erasing unit is one of the lower physical programming units, the memory management circuit is further configured to write second data into a second physical programming unit of the first physical erasing unit, wherein the second physical programming unit of the first physical erasing unit belongs to one of the upper physical programming units, and the second physical programming unit of the first physical erasing unit and the first physical programming unit of the first physical erasing unit are formed by a plurality of memory cells disposed on a first word line.

A memory storage apparatus is provided according to an exemplary embodiment of the present invention, which includes a connection interface unit, a rewritable non-volatile memory module and a memory control circuit unit. The connection interface unit is configured to couple to a host system. The rewritable non-volatile memory module has a plurality of physical erasing units, and each of the physical erasing units has a plurality of physical programming units including a plurality of lower physical programming units and a plurality of upper physical programming units. The memory control circuit unit is coupled to the connection interface unit and the rewritable non-volatile memory module, and configured to temporarily store first data into a buffer memory. In addition, the memory control circuit unit is further configured to start a flush operation to write the first data from the buffer memory into a first physical programming unit of a first physical erasing unit. In addition, after writing the first data into the first physical programming unit of the first physical erasing unit, the memory control circuit unit is further configured to determine whether the first physical programming unit of the first physical erasing unit is one of the lower physical programming units. If the first physical programming unit of the first physical erasing unit is one of the lower physical programming units, the memory control circuit unit is further configured to write second data into a second physical programming unit of the first physical erasing unit, wherein the second physical programming unit of the first physical erasing unit belongs to one of the upper physical programming units, and the second physical programming unit of the first physical erasing unit and the first physical programming unit of the first physical erasing unit are formed by a plurality of memory cells disposed on a first word line.

Based on above, in the data storing method, the memory control circuit unit and the memory storage apparatus according to the exemplary embodiments of the invention, the data may be prevented from losing by executing the writing operation to the corresponding upper physical programming unit while writing the data into the lower physical programming unit during the flush operation.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8 is a schematic diagram illustrating a logical address-to-physical address mapping table according to an exemplary embodiment of the present invention.

FIG. 9 is a schematic diagram illustrating an arrange sequence of the physical programming units according to an exemplary embodiment.

DESCRIPTION OF THE EMBODIMENTS

Figure 1:
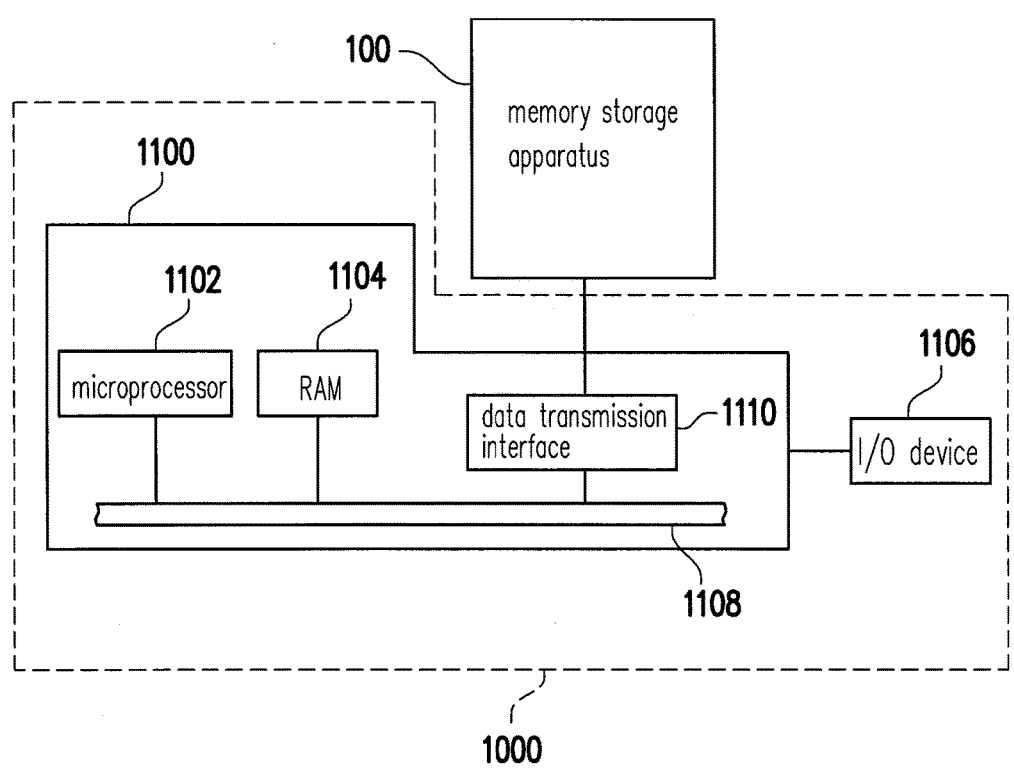
FIG. 1 illustrates a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit). The memory storage apparatus is usually configured together with a host system so that the host system may write data to or read data from the memory storage apparatus.

FIG. 1 illustrates a host system and a memory storage apparatus according to an exemplary embodiment.

Figure 2:
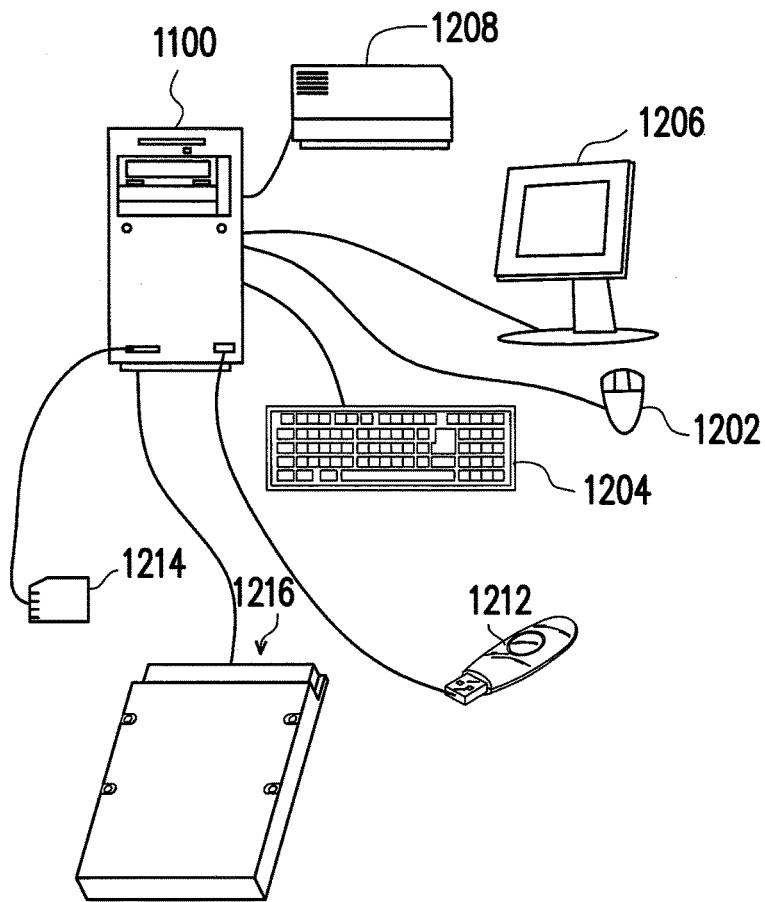
FIG. 2 is a schematic diagram illustrating a computer, an input/output device, and a memory storage apparatus according to an exemplary embodiment of the present invention.

Referring to FIG. 1, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In an exemplary embodiment, the memory storage apparatus 100 is coupled to other devices of the host system 1000 through the data transmission interface 1110. By using the microprocessor 1102, the random access memory (RAM) 1104 and the Input/Output (I/O) device 1106, data may be written into the memory storage apparatus 100 or may be read from the memory storage apparatus 100. For example, the memory storage apparatus 100 may be a rewritable non-volatile memory storage apparatus such as a flash drive 1212, a memory card 1214, or a solid state drive (SSD) 1216 as shown in FIG. 2.

Figure 3:
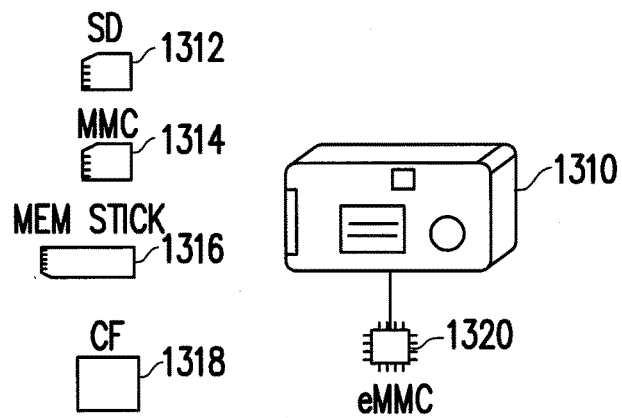
FIG. 3 is a schematic diagram illustrating a host system and a memory storage apparatus according to an exemplary embodiment of the present invention.

Generally, the host system 1000 may substantially be any system capable of storing data with the memory storage apparatus 100. Although the host system 1000 is described as a computer system in the present exemplary embodiment, in another exemplary embodiment, the host system 1000 may be a digital camera, a video camera, a telecommunication device, an audio player, or a video player. For example, when the host system is a digital camera (video camera) 1310, the rewritable non-volatile memory storage apparatus may be a SD card 1312, a MMC card 1314, a memory stick 1316, a CF card 1318 or an embedded storage device 1320 (as shown in FIG. 3). The embedded storage device 1320 includes an embedded MMC (eMMC). It should be mentioned that the eMMC is directly coupled to a substrate of the host system.

Figure 4:
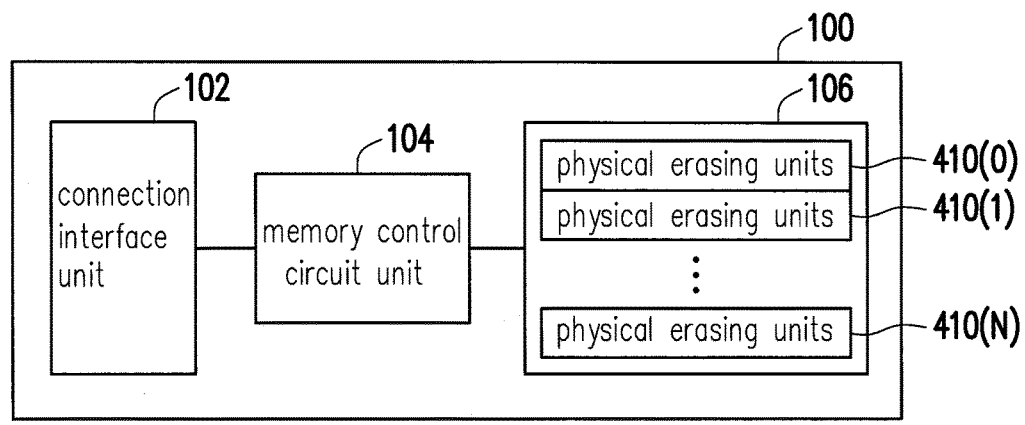
FIG. 4 is a schematic block diagram illustrating the memory storage apparatus depicted in FIG. 1.

FIG. 4 is a schematic block diagram illustrating the memory storage apparatus depicted in FIG. 1.

Referring to FIG. 4, the memory storage apparatus 100 includes a connection interface unit 102, a memory control circuit unit 104 and a rewritable non-volatile memory storage module 106.

In the present exemplary embodiment, the connection interface unit 102 is compatible with a serial advanced technology attachment (SATA) standard. However, the present invention is not limited thereto, and the connection interface unit 102 may also be compatible to Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit and the memory control circuit unit may be packaged into one chip, or distributed outside of a chip containing the memory control circuit unit.

The memory control circuit unit 104 is configured to execute a plurality of logic gates or control instructions which are implemented in a hardware form or in a firmware form, so as to perform operations of writing, reading or erasing data in the rewritable non-volatile memory storage module 106 according to the commands from the host system 1000.

The rewritable non-volatile memory storage module 106 is coupled to the memory control circuit unit 104 and configured to store data written from the host system 1000. The rewritable non-volatile memory storage module 106 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the present invention is not limited thereto. Each physical erasing unit is composed by 64 physical programming units, 256 physical programming units or any amount of the physical programming units.

More specifically, the physical erasing unit is the minimum unit for erasing. Namely, each physical erasing unit contains the least number of memory cells to be erased together. The physical programming unit is the minimum unit for programming. That is, the physical programming unit is the minimum unit for writing data. Each physical programming unit usually includes a data bit area and a redundant bit area. The data bit area having multiple physical access addresses is used to store user data, and the redundant bit area is used to store system data (e.g., control information and error checking and correcting code). In the present exemplary embodiment, each data bit area of the physical programming unit contains 4 physical access addresses, and the size of each physical access address is 512 bytes. However, in other exemplary embodiments, more or less number of the physical address may be contained in the data bit area, amount and size of the physical access addresses are not limited in the present invention. For example, in an exemplary embodiment, the physical erasing unit is a physical block, and the physical programming unit is a physical page or a physical sector, but the present invention is not limited thereto.

In the present exemplary embodiment, the rewritable non-volatile memory module 106 is a Multi Level Cell (MLC) NAND flash memory module (i.e., a flash memory module capable of storing two bits of data in one memory cell). However, the invention is not limited thereto. The rewritable non-volatile memory storage module 106 may also be other memory modules having the same features.

Figure 5:
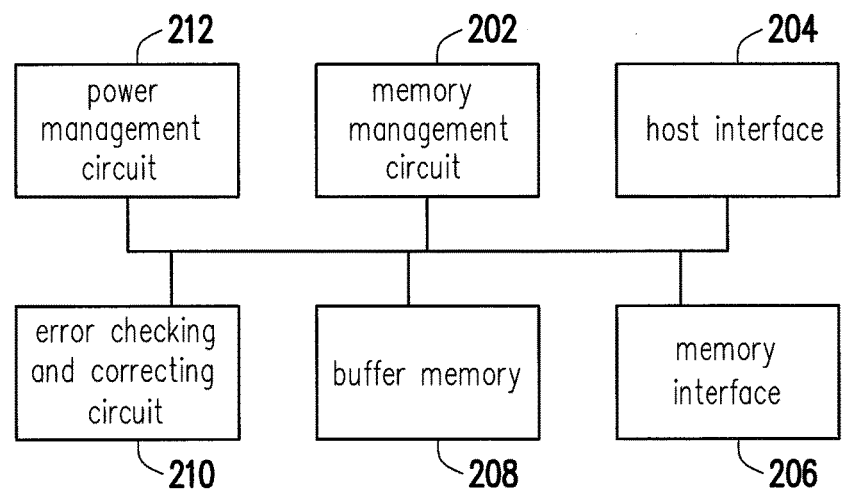
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 104 includes a memory management circuit 202, a host interface 204 and a memory interface 206.

The memory management circuit 202 is configured to control overall operations of the memory control circuit unit 104. Specifically, the memory management circuit 202 has a plurality of control instructions. When the memory storage apparatus 100 operates, the control instructions are executed to perform various operations such as data writing, data reading and data erasing.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage apparatus 100 operates, the control instructions are executed by the microprocessor to perform operations of writing, reading or erasing data.

In another exemplary embodiment of the present invention, the control instructions of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). Particularly, the ROM has an activate code, which is executed by the microprocessor unit to load the control instructions stored in the rewritable non-volatile memory module 106 to the RAM of the memory management circuit 202 when the memory control circuit unit 104 is enabled. Next, the control instructions are executed by the microprocessor unit to perform operations of writing, reading or erasing data.

Further, in another exemplary embodiment, the control instructions of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured for managing the physical erasing unit of the rewritable non-volatile memory module 106; the memory writing circuit is configured for issuing a write command to the rewritable non-volatile memory module 106 in order to write data into the rewritable non-volatile memory module; the memory reading circuit is configured for issuing a read command to the rewritable non-volatile memory module 106 in order to read data from the rewritable non-volatile memory module 106; the memory erasing circuit is configured for issuing an erase command to the rewritable non-volatile memory module 106 in order to erase data from the rewritable non-volatile memory module 106; the data processing circuit is configured for processing both the data to be written into the rewritable non-volatile memory module 106 and the data to be read from the rewritable non-volatile memory module 106.

The host interface 204 is coupled to the memory management circuit 202 and configured for receiving and identifying commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment of the invention, the memory control circuit unit 104 further includes a buffer memory 208, a power management circuit 210 and an error checking and correcting circuit 212.

The buffer memory 208 is coupled to the memory management circuit 202 and configured to temporarily store data and commands from the host system 1000 or data from the rewritable non-volatile memory module 106.

The power management unit 210 is coupled to the memory management circuit 202 and configured to control a power of the memory storage apparatus 100.

The error checking and correcting circuit 212 is coupled to the memory management circuit 202 and configured to perform an error checking and correcting process to ensure the correctness of data. Specifically, when the memory management circuit 202 receives a write command from the host system 1000, the error checking and correcting circuit 212 generates an error checking and correcting code (ECC code) for data corresponding to the write command, and the memory management circuit 202 writes data and the ECC code corresponding to the write command to the rewritable non-volatile memory module 106. Next, when reading data from the rewritable non-volatile memory module 106, the memory management circuit 202 also reads the ECC Code corresponding to such data, and the error checking and correcting circuit 212 performs an error checking and correcting process on the read data based on the read ECC code.

Figure 6:
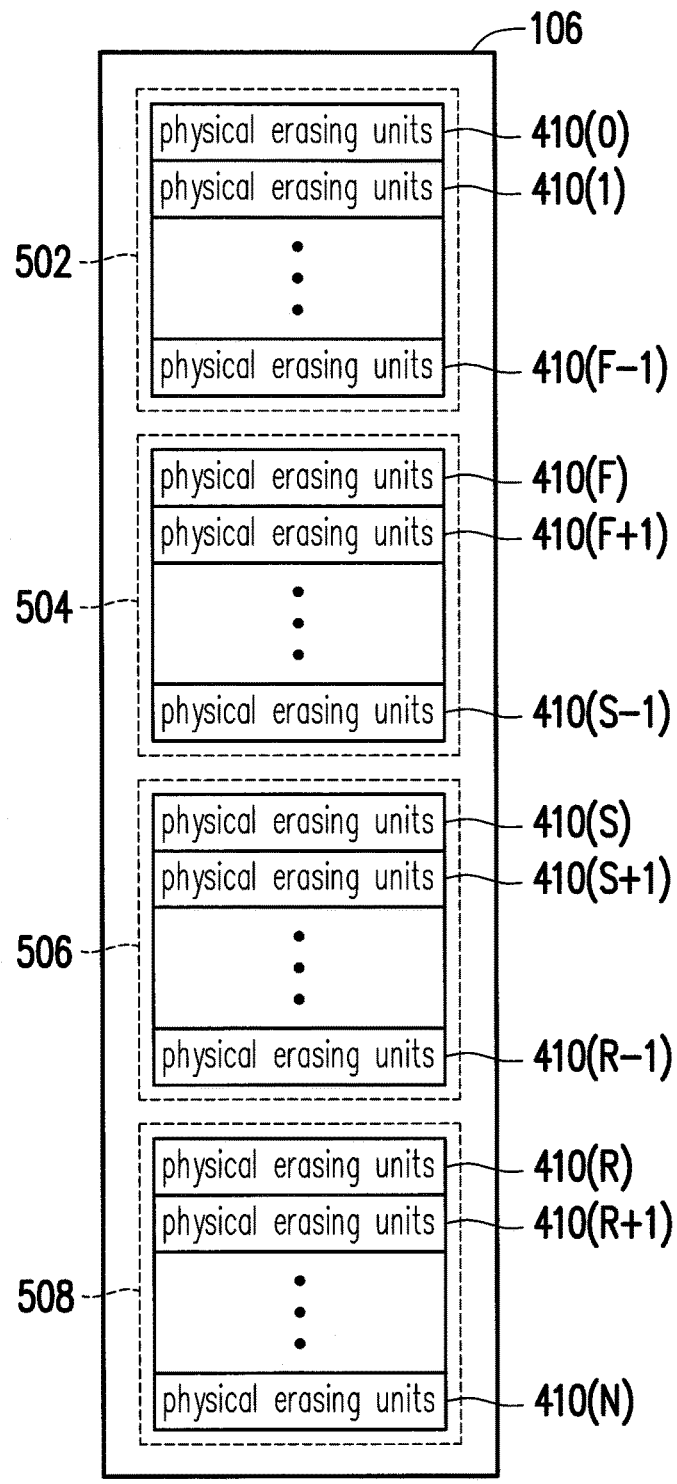
FIG. 6 and FIG. 7 are schematic diagrams illustrating a management of physical erasing units according to an exemplary embodiment.
Figure 7:
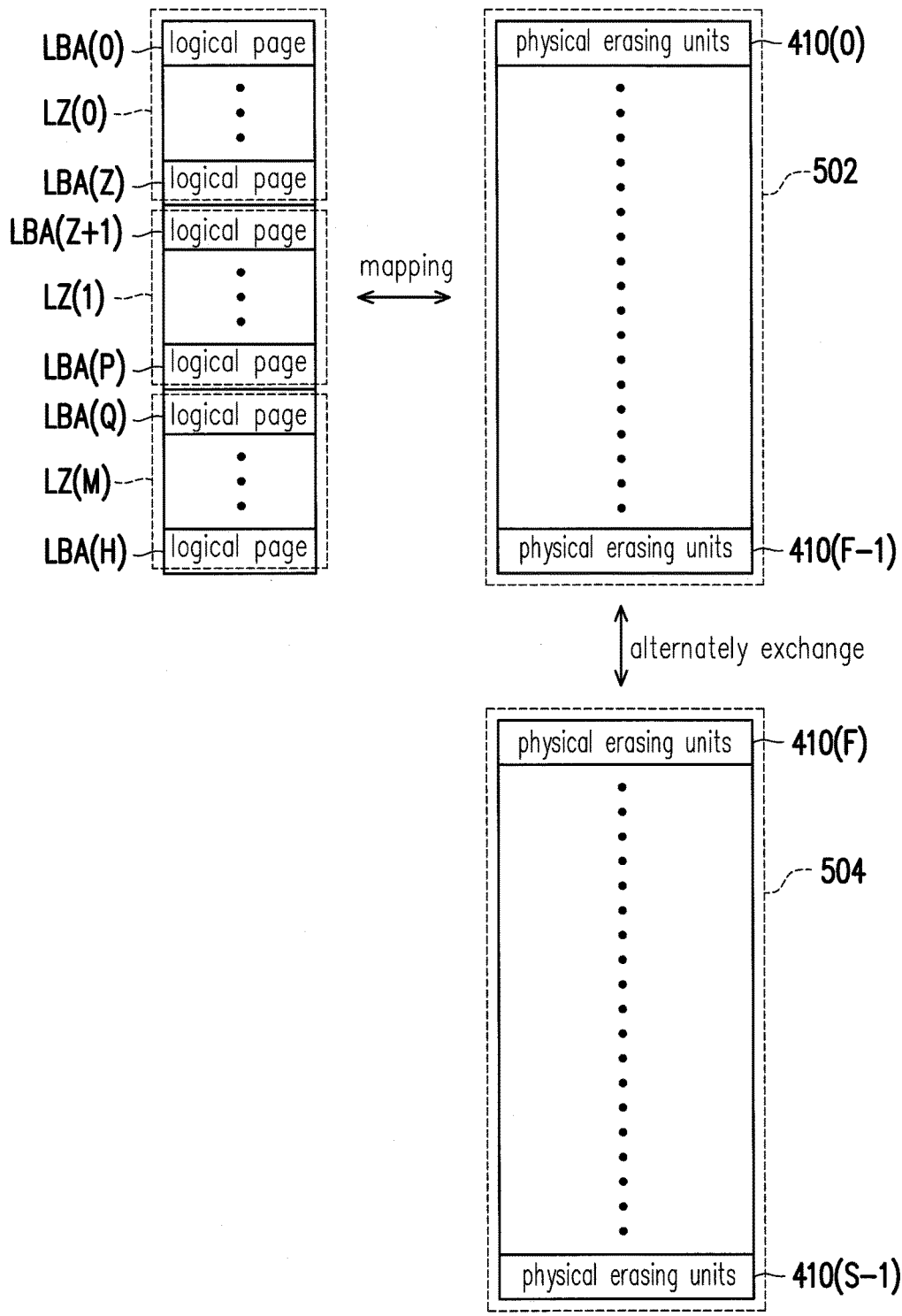

FIG. 6 and FIG. 7 are schematic diagrams illustrating a management of the physical erasing units according to an exemplary embodiment.

Referring to FIG. 6, the memory control circuit unit 104 (or the memory management circuit 202) may logically group the physical erasing units 410(0) to 410(N) into a data area 502, a spare area 504, a system area 506 and a replacement area 508.

Logically, the physical erasing units belonging to the data area 502 and the spare area 504 are configured to store data from the host system 1000. More specifically, the physical erasing units of the data area 502 are regarded as the physical erasing units stored with the data, whereas the physical erasing units of the spare area 504 are configured for exchanging the physical erasing units of the data area 502. In other words, when the write command and the data to be written are received from the host system 1000, the memory management unit 202 may select the physical erasing units from the spare area 504, and write the data into the selected physical erasing units for exchanging the physical erasing units in the data area 502.

The physical erasing units logically belonging to the system area 506 are configured to record system data. For example, the system data includes information related to manufacturer and model of the rewritable non-volatile memory module, a number of physical erasing units in the rewritable non-volatile memory module, a number of the physical programming units in each physical erasing unit, and so forth.

The physical erasing units logically belonging to the replacement area 508 are used in a bad physical erasing unit replacement procedure for replacing damaged physical erasing units. More specifically, if available physical erasing units are still present in the replacement area 508 when the physical erasing units of the data area 502 are damaged, the memory management circuit 202 may select the available physical erasing units from the replacement area 508 for replacing the damaged physical erasing units.

In particular, the numbers of the physical erasing units in the data area 502, the spare area 504, the system 506 and the replacement area 508 may be different from one another according to the different memory specifications. In addition, it should be understood that, during the operation of the memory storage apparatus 100, grouping relations of the physical erasing units related to the data area 502, the spare area 504, the system area 506, and replacement area 508 may be dynamically changed. For example, when the damaged physical erasing units in the spare area 504 are replaced by the physical erasing units in the replacement area 508, the physical erasing units originally from the replacement area 508 are then related to the spare area 504.

Referring to FIG. 7, the memory control circuit unit 104 (or the memory management circuit 202) configures logical pages LBA(0) to LBA(H) for mapping to the physical programming units in the data area 502. Further, when the host system 1000 intends to write the data into the logical pages or update the data stored in the logical pages, the memory control circuit unit 104 (or the memory management unit 202) may select one physical erasing units from the spare area 504 for writing the data as an alternately exchange of the physical erasing units of the data area 502.

In order to identify the physical erasing units for storing the data of the each logical page, in the present exemplary embodiment, the memory control circuit unit 104 (or the memory management circuit 202) may record mapping relations between the logical pages and the physical programming units. Further, when the host system 1000 intends to access the data in the logical page, the memory control circuit unit 104 (or the memory management circuit 202) may confirm the physical programming units mapped to said logical page, and access the data in said physical programming units. For instance, in the present exemplary embodiment, the memory control circuit unit 104 (or the memory management circuit 202) may store a logical address-to-physical address mapping table in the rewritable non-volatile memory module 106 for recording the physical programming units mapped to each of the logical pages, and the logical address-to-physical address mapping table are loaded into the buffer memory 208 for maintenance when the memory control circuit unit 104 (or the memory management circuit 202) intends to the access the data.

It should be noted that, a mapping table recording that records the mapping relations for all the logical pages cannot be stored because a capacity of the buffer memory 208 is limited. Therefore, in the present exemplary embodiment, the memory control circuit unit 104 (or the memory management unit 202) groups the logical pages LBA(0) to LBA(H) as a plurality of logical zones LZ(0) to LZ(M), and arranges one logical address-to-physical address mapping table for each of the logical zones. In particular, when the memory control circuit unit 104 (or the memory management unit 202) intends to update the mapping table for one specific logical page, the logical address-to-physical address mapping table corresponding to the logical zone to which the specific logical page belongs is loaded to into the buffer memory 208 to be updated.

A described above, when the write command is executed, regardless of which of the logical pages is the data currently written to, the memory control circuit unit 104 (or the memory management unit 202) may write the data in a manner of one physical programming unit after another physical programming unit (hereinafter, refer to as a random writing mechanism). More specifically, the memory control circuit unit 104 (or the memory management circuit 202) may select an empty physical erasing unit from the spare area 504 to be used as a current or an active physical erasing unit used to write the data. Further, when the active physical erasing unit being used is full, the memory control circuit unit 104 (or the memory management circuit 202) may select another empty physical erasing unit from the spare area 504 to be used as the active physical erasing unit used to continuously write a random data corresponding to the write command from the host system 1000. Particularly, in order to prevent the physical erasing units of the spare area 504 from being used up, when the number of the physical erasing units of the spare area 504 is reduced to a garbage collection threshold value being set, the memory control circuit unit 104 (or the memory management circuit 202) may execute a data merging procedure, so that the data of at least one physical erasing unit of the data area 502 becomes invalid data, and all the data being the invalid data in the data area 502 are then related back to the spare area 504. For instance, when the data merging procedure is executed, the memory control circuit unit 104 (or the memory management circuit 202) is required to use at least one empty physical erasing unit. Therefore, the garbage collection threshold value is set to be at least grater than a minimum threshold value (i.e., 1).

FIG. 8 is a schematic diagram illustrating a logical address-to-physical address mapping table according to an exemplary embodiment of the present invention.

Referring to FIG. 8, a logical address-to-physical address mapping table 800 includes a logical page field 802 and a physical programming unit field 804. The logical page field 802 records each reference number of each of the logical pages being arranged, and the physical programming unit field 804 records the physical programming units mapped to each of the logical pages. For instance, in the case the memory storage apparatus 100 is brand new and never used for storing data, physical erasing units 410(F) to 410(S-1) are associated to the spare area 504, and each field corresponding to each of the physical programming units mapped to each of the logical pages in the logical address-to-physical address mapping table 800 is marked as void value (e.g., NULL).

FIG. 9 is a schematic diagram illustrating an arrange sequence of the physical programming units according to an exemplary embodiment. Herein, a physical erasing unit 410(0) is described herein as an example for description, and structures of the rest of the physical erasing units may also be deduced by analogy.

Referring to FIG. 9, the physical erasing unit 410(0) includes a plurality of physical programming units PBA(0-0) to PBA(0-K). In the present exemplary embodiment, K is an integer for example. For instance, K is 255. In this case, the physical programming unit PBA(0-0) and the physical programming unit PBA(0-2) are formed by memory cells disposed on a word line W(0); the physical programming unit PBA(0-1) and the physical programming unit PBA(0-4) are formed by memory cells disposed on a word line W(1); the physical programming unit PBA(0-3) and the physical programming unit PBA(0-6) are formed by memory cells disposed on a word line W(2); the physical programming unit PBA(0-5) and the physical programming unit PBA(0-8) are formed by memory cells disposed on a word line W(3); and the rest may be deduced by analogy, that is, the physical programming unit PBA(0-(K-4)) and the physical programming unit PBA(0-(K-1)) are formed by memory cells disposed on a word line W(L-1), and the physical programming unit PBA(0-(K-2)) and the physical programming unit PBA(0-K) are formed by memory cells disposed on a word line W(L). Herein, the physical programming units PBA(0-0), PBA(0-1), PBA(0-3), PBA(0-5), . . . , PBA(0-(K-4)), PBA(0-(K-2)) are the lower physical programming units, and the physical programming units PBA(0-2), PBA(0-4), PBA(0-6), PBA(0-8), . . . , PBA(0-(K-1)), PBA(0-K) are the upper physical programming units.

In the present exemplary embodiment, when it is intended to write the data into the physical programming units, the memory control circuit unit 104 (or the memory management circuit 202) may determine a storage status of the rewritable non-volatile memory module 106. If the storage status of the rewritable non-volatile memory module 106 is a preset status, the memory control circuit unit 104 (or the memory management circuit 202) writes the data into the rewritable non-volatile memory module 106 by using a first writing mode; and if the storage status of the rewritable non-volatile memory module 106 is not the preset status, the memory control circuit unit 104 (or the memory management circuit 202) writes the data into the rewritable non-volatile memory module 106 by using a second writing mode.

In the present exemplary embodiment, in the first writing mode, the memory control circuit unit 104 (or the memory management circuit 202) uses the lower physical programming units to store the data to be written by the host system 1000 instead of using the upper physical programming units to store the data. In the second writing mode, the memory control circuit unit 104 (or the memory management circuit 202) uses the lower physical programming units and the upper physical programming units to store the data to be written by the host system 1000. In other words, in the second writing mode, the lower physical programming units and the upper physical programming units are both selected to store the data; whereas in the first writing mode, only the lower physical programming units are selected to store the data. Accordingly, a writing speed of the first writing mode is higher than a writing speed of the second writing mode.

In the present exemplary embodiment, the memory control circuit unit 104 (or the memory management circuit 202) may determine whether the number of the physical programming units stored with valid data in the rewritable non-volatile memory module 106 is less than a first threshold. If the number of the physical programming units stored with the valid data in the rewritable non-volatile memory module 106 is less than the first threshold, the memory control circuit unit 104 (or the memory management circuit 202) identifies that the storage status of the rewritable non-volatile memory module 106 is the preset status; and if the number of the physical programming units stored with the valid data in the rewritable non-volatile memory module 106 is not less than the first threshold, the memory control circuit unit 104 (or the memory management circuit 202) identifies that the storage status of the rewritable non-volatile memory module 106 is not the preset status. Herein, the first threshold may be set to the number of all the physical programming units multiplied by a predetermined proportion. For instance, the predetermined proportion may be 50%, but the present exemplary embodiment is not limited thereto.

In the present exemplary embodiment, the memory control circuit unit 104 (or the memory management circuit 202) may determine whether the number of the physical programming units stored with the valid data in the rewritable non-volatile memory module 106 is less than the first threshold according to information in the logical address-to-physical address mapping table. More specifically, when the valid data belonging to one logical page is written into one physical programming unit, said logical page is mapped to said physical programming unit in the logical address-to-physical address mapping table. Accordingly, the memory control circuit unit 104 (or the memory management circuit 202) may obtain the number of the physical programming units stored with the valid data by calculating the number of the physical programming units recorded in the logical address-to-physical address mapping table.

It should be noted that, in addition to the method of identifying whether the storage status of the rewritable non-volatile memory module 106 is the preset status by comparing the number of physical programming units stored with the valid data in the rewritable non-volatile memory module 106 with the first threshold, in another exemplary embodiment of the present invention, the memory control circuit unit 104 (or the memory management circuit 202) may also identify whether the storage status of the rewritable non-volatile memory module 106 is the preset status according to the number of physical erasing units in the spare area 414. More specifically, if the number of the physical erasing units in the spare area 414 is less than a second threshold, the memory control circuit unit 104 (or the memory management circuit 202) may identify that the storage status of the rewritable non-volatile memory module 106 is not the preset status; and if the number of the physical erasing unit in the spare area 414 is not less than the second threshold, the memory control circuit unit 104 (or the memory management circuit 202) may identify that the storage status of the rewritable non-volatile memory module 106 is the preset status. For instance, the second threshold may be set to 8, but the present exemplary embodiment is not limited thereto.

Figure 10:
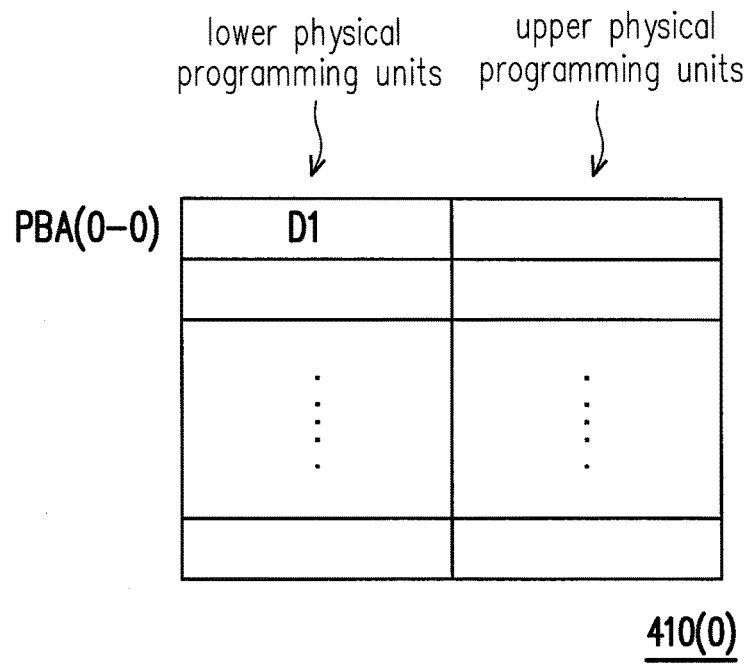
FIG. 10 to FIG. 12 are schematic diagrams illustrating a writing operation executed when the storage status of the rewritable non-volatile memory module 106 is the preset status according to an exemplary embodiment of the present invention.
Figure 11:
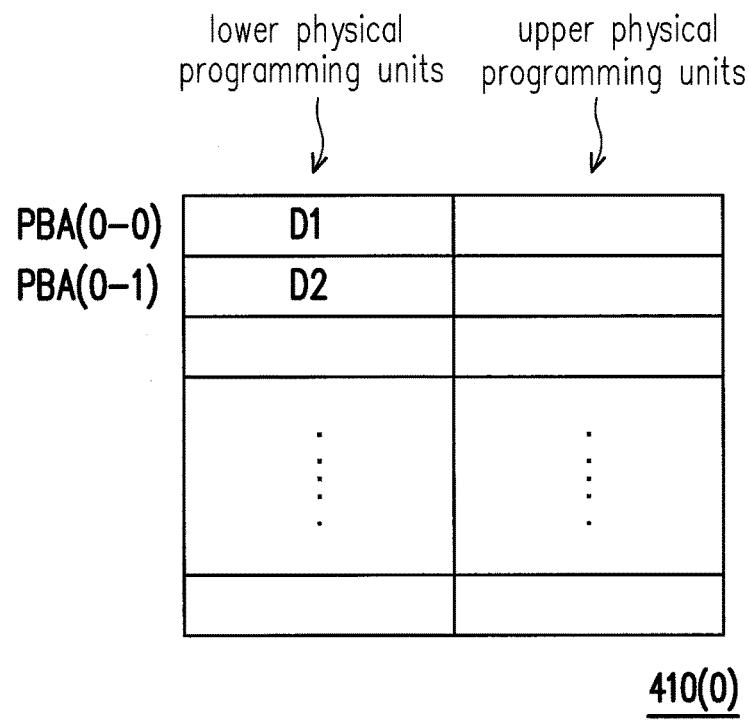
Figure 12:
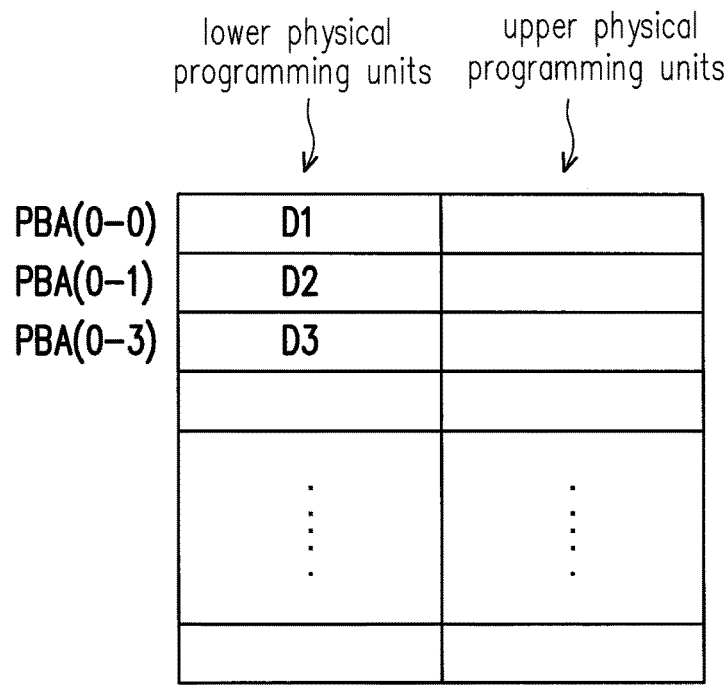

FIG. 10 to FIG. 12 are schematic diagrams illustrating a writing operation executed when the storage status of the rewritable non-volatile memory module 106 is the preset status according to an exemplary embodiment of the present invention.

Referring to FIG. 10, if the host system 1000 intends to write data D1 into the logical page LBA(1) under the status depicted in FIG. 9, the memory control circuit unit 104 (or the memory management circuit 202) may select one physical erasing unit (e.g., the physical erasing unit 410(0)) from the spare area 504, and write the data D1 to be written from the host system 1000 into the physical programming unit PBA(0-0). After the data is written, the memory control circuit unit 104 (or the memory management circuit 202) maps the logical page LBA(1) to the physical programming unit PBA(0-0) in the logical address-to-physical address mapping table 800.

Referring to FIG. 11, if the host system 1000 intends to write data D2 into the logical page LBA(129) under the status depicted in FIG. 10, the memory control circuit unit 104 (or the memory management circuit 202) writes the data D2 to be written from the host system 1000 into the physical programming unit PBA(0-1). In this case, the memory control circuit unit 104 (or the memory management circuit 202) maps the logical page LBA(129) to the physical programming unit PBA(0-1) in the logical address-to-physical address mapping table 800.

Referring to FIG. 12, if the host system 1000 intends to write data D3 into the logical page LBA(1) under the status depicted in FIG. 11, the memory control circuit unit 104 (or the memory management circuit 202) writes the data D3 to be written from the host system 1000 into the physical programming unit PBA(0-3). In this case, the memory control circuit unit 104 (or the memory management circuit 202) maps the logical page LBA(1) to the physical programming unit PBA(0-3) in the logical address-to-physical address mapping table 800.

During the writing operation of FIGS. 10 to 12, because the storage status of the rewritable non-volatile memory module 106 is the preset status, the memory control circuit unit 104 (or the memory management circuit 202) selects the lower physical programming units (i.e., the physical programming unit PBA(0-0), the physical programming unit PBA(0-1) and the physical programming unit PBA(0-3)) for writing data instead of using the upper physical programming units (i.e., the first writing mode).

Figure 13:
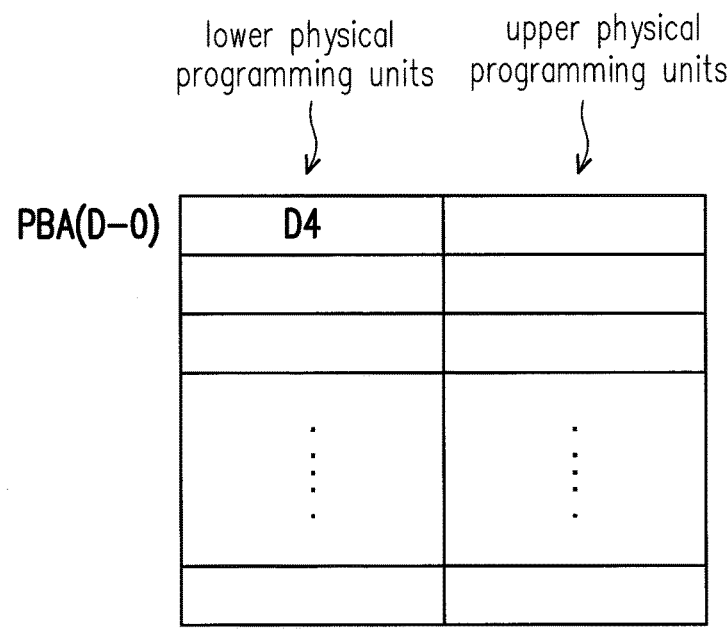
FIG. 13 to FIG. 15 are schematic diagrams illustrating a writing operation executed when the storage status of the rewritable non-volatile memory module 106 is not the preset status according to an exemplary embodiment of the present invention.
Figure 14:
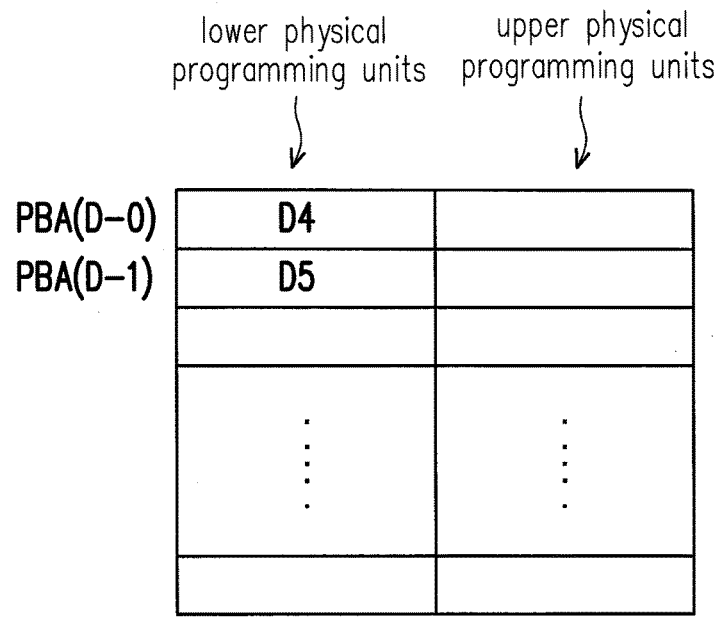
Figure 15:
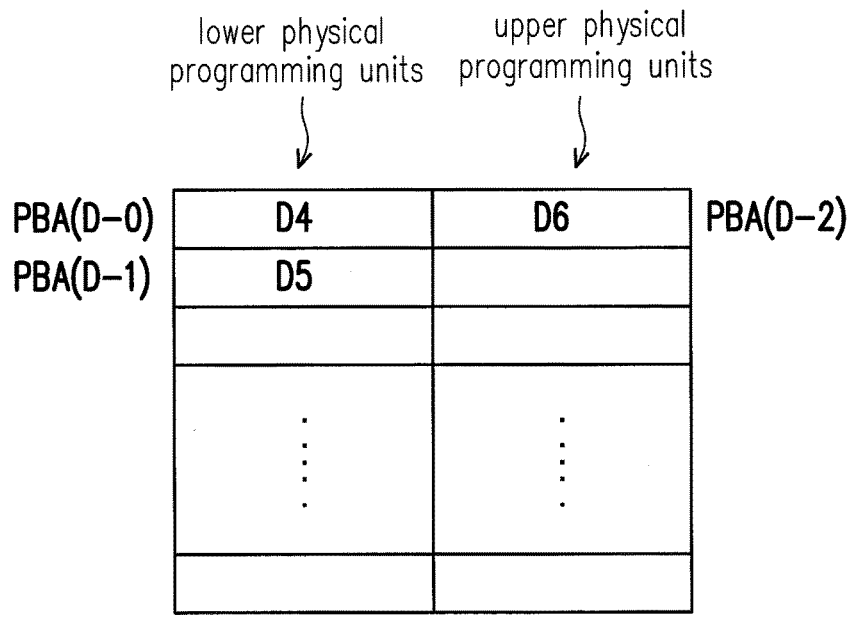

FIG. 13 to FIG. 15 are schematic diagrams illustrating a writing operation executed when the storage status of the rewritable non-volatile memory module 106 is not the preset status according to an exemplary embodiment of the present invention.

Referring to FIG. 13, if the host system 1000 intends to write data D4 into the logical page LBA(1) when the storage status of the rewritable non-volatile memory module 106 is not the preset status, the memory control circuit unit 104 (or the memory management circuit 202) may select one physical erasing unit (e.g., the physical erasing unit 410(D)) from the spare area 504, and write the data D4 to be written from the host system 1000 into the physical programming unit PBA(D-0). After the data is written, the memory control circuit unit 104 (or the memory management circuit 202) maps the logical page LBA(1) to the physical programming unit PBA(D-0) in the logical address-to-physical address mapping table 800.

Referring to FIG. 14, if the host system 1000 intends to write data D5 into the logical page LBA(129) under the status depicted in FIG. 13, the memory control circuit unit 104 (or the memory management circuit 202) writes the data D5 to be written from the host system 1000 into the physical programming unit PBA(D-1). In this case, the memory control circuit unit 104 (or the memory management circuit 202) maps the logical page LBA(129) to the physical programming unit PBA(D-1) in the logical address-to-physical address mapping table 800.

Referring to FIG. 15, if the host system 1000 intends to write data D6 into the logical page LBA(1) under the status depicted in FIG. 14, the memory control circuit unit 104 (or the memory management circuit 202) writes the data D6 to be written from the host system 1000 into the physical programming unit PBA(D-2). In this case, the memory control circuit unit 104 (or the memory management circuit 202) maps the logical page LBA(1) to the physical programming unit PBA(D-2) in the logical address-to-physical address mapping table 800.

During the writing operation of FIGS. 13 to 15, because the storage status of the rewritable non-volatile memory module 106 is not the preset status, the lower physical programming units and the upper physical programming units (i.e., the physical programming unit PBA(D-0), the physical programming unit PBA(D-1) and the physical programming unit PBA(D-2)) are both used for writing data (i.e., the second writing mode).

In the present exemplary embodiment, when the write command and the data to be written are received from the host system 1000, the memory control circuit unit 104 (or the memory management circuit 202) temporarily stores the write command and the data into the buffer memory 208, and replies the host system 100 that the write command is completed. Thereafter, the memory control circuit unit 104 (or the memory management circuit 202 may process the write command at an appropriate time, such that a performance of the memory storage apparatus 100 may be improved. For instance, since the buffer memory 208 is a volatile memory, in order to prevent the data from losing due to abnormal power failure, when a condition that the command or the data is not received from the host system 100 lasts a predetermined time, the memory control circuit unit 104 (or the memory management circuit 202) executes a flush operation in a background execution mode to write the data temporarily stored in the buffer memory 208 into the rewritable non-volatile memory module 106. More specifically, when the memory storage apparatus 100 receives the command from the host system 1000, the memory control circuit unit 104 (or the memory management circuit 202) needs to execute the command instantly and responds the same to the host system 100 as to avoid timeout. Herein, a mode that is used for responding to the procedure executed by the host system 1000 is referred to as a foreground execution mode. In contrast, the memory control circuit unit 104 (or the memory management circuit 202) may also operate (e.g., moving the data) at idle time (i.e., when not receiving the command transmitted by the host system 1000). Herein, a mode that is not used for responding to the procedure executed by the host system 1000 is referred to as the background execution mode.

Particularly, in the present exemplary embodiment, after the flush operation is executed to write the data into the physical programming units, if the physical programming unit written with the data is the lower physical programming unit, the memory control circuit unit 104 (or the memory management circuit 202) may also write the data into the corresponding upper physical programming unit, so as to prevent the data stored in the lower physical programming units from losing due to programming fail occurred the upper physical programming units.

Figure 16:
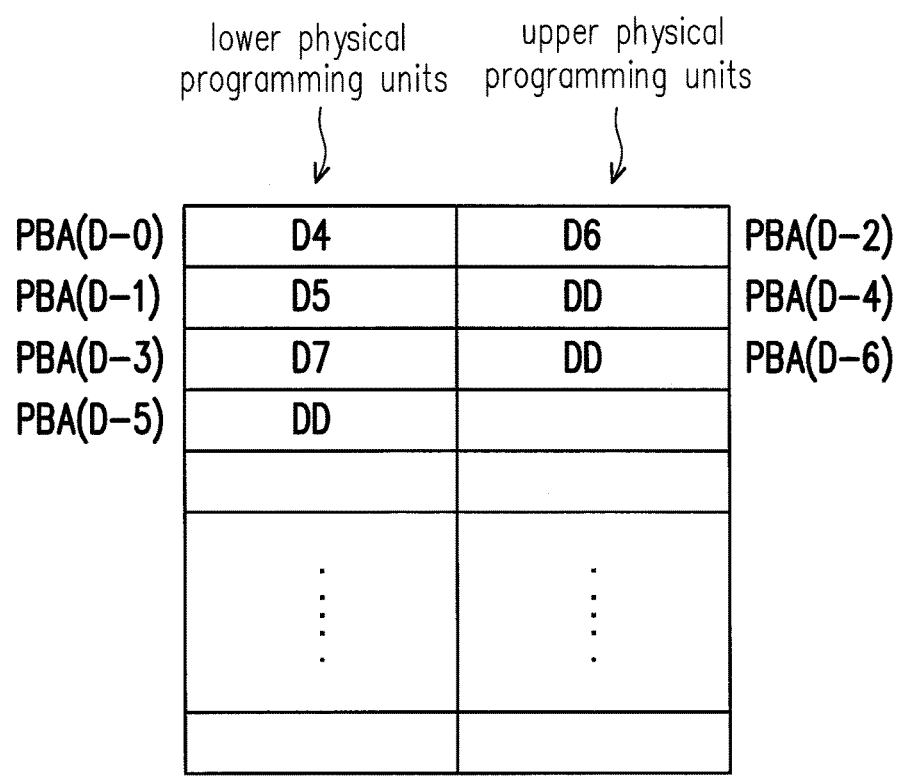
FIG. 16 is a schematic diagram illustrating the flush operation for writing data into the lower physical programming unit according to an exemplary embodiment of the present invention.

FIG. 16 is a schematic diagram illustrating the flush operation for writing data into the lower physical programming unit according to an exemplary embodiment of the present invention.

Referring to FIG. 16, in an example in which the flush operation is executed and the data D4, D5, D6 and D7 are written from the buffer memory 208 into the empty physical programming units PBA(D-0) to PBA(D-3) in one active physical erasing unit (e.g., the physical erasing unit 410(D)), the memory control circuit unit 104 (or the memory management circuit 202) may write a dummy data DD which is preset in advance, into the upper physical programming unit PBA(D-4) corresponding to the lower physical programming unit PBA(D-1), the lower physical programming unit PBA(D-5), the upper physical programming unit PBA(D-6) corresponding to the lower physical programming unit PBA(D-3). Therein, the upper physical programming unit PBA(D-6) and the lower physical programming unit PBA(D-3) are formed by memory cells disposed on the same word line (hereinafter, a first word line); the upper physical programming unit PBA(D-4) is formed by memory cells disposed on one word line (hereinafter, a second word line) adjacent to the first word line; and the lower physical programming unit PBA(D-5) is formed by the memory cells disposed on another word line (hereinafter, a third word line) adjacent to the first word line. In this example, if the data D5 stored in the physical programming unit PBA(D-1) or the data D7 stored in the physical programming unit PBA(D-3) is lost due to programming fail occurred during the process of programming the dummy data DD into the physical programming unit PBA(D-4) or the physical programming unit PBA(D-6), the memory control circuit unit 104 (or the memory management circuit 202) is capable of recovering the data D5 and the data D7 because the data D5 and the data D7 stored in the buffer memory 208 are not yet deleted. On the other hand, after the dummy data DD is successfully written into the physical programming unit PBA(D-4) and the physical programming unit PBA(D-6), the data D5 and the data D7 will not lost due to programming fail occurred on the physical programming unit PBA(D-4) and the physical programming unit PBA(D-6). Accordingly, the memory control circuit unit 104 (or the memory management circuit 202) may delete the data D5 and the data D7 in the buffer memory 208, so as to complete the flush operation.

It should be understood that, in the example described in FIG. 16, the memory control circuit unit 104 (or the memory management circuit 202) needs to write the dummy data into two of the upper physical programming units during the flush operation because of the arrange sequence of the physical programming units in the physical erasing unit (as shown in FIG. 9). However, the present invention is not limited thereto. For example, in case the arrange sequences of the lower physical programming units and upper physical programming units in the physical erasing unit are symmetrically arranged (as shown in FIG. 17), the memory control circuit unit 104 (or the memory management circuit 202) may only need to write the dummy data into one upper physical programming unit during the flush operation.

Figure 18:
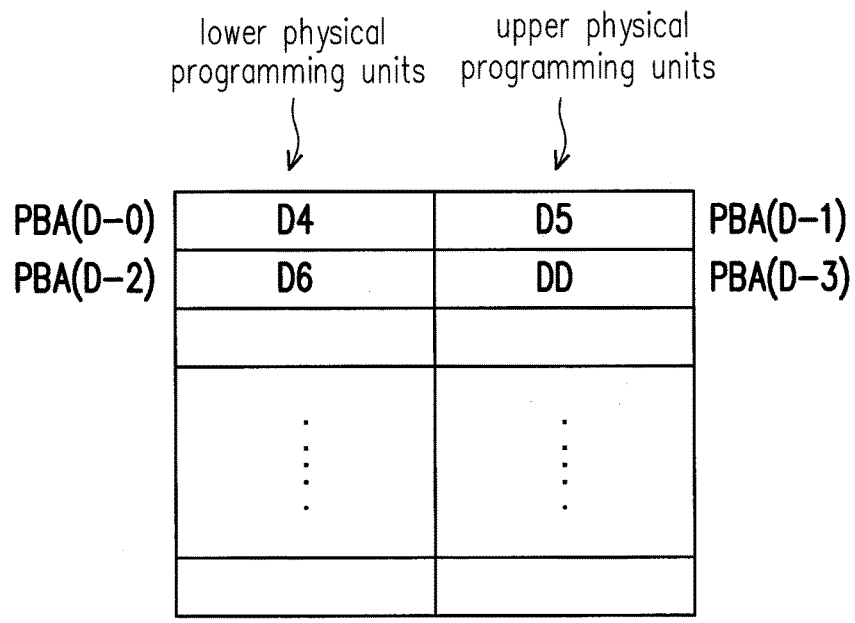
FIG. 18 is a schematic diagram illustrating the flush operation for writing data into the lower physical programming unit according to another exemplary embodiment of the present invention.

FIG. 18 is a schematic diagram illustrating the flush operation for writing data into the lower physical programming unit according to another exemplary embodiment of the invention.

Figure 17:
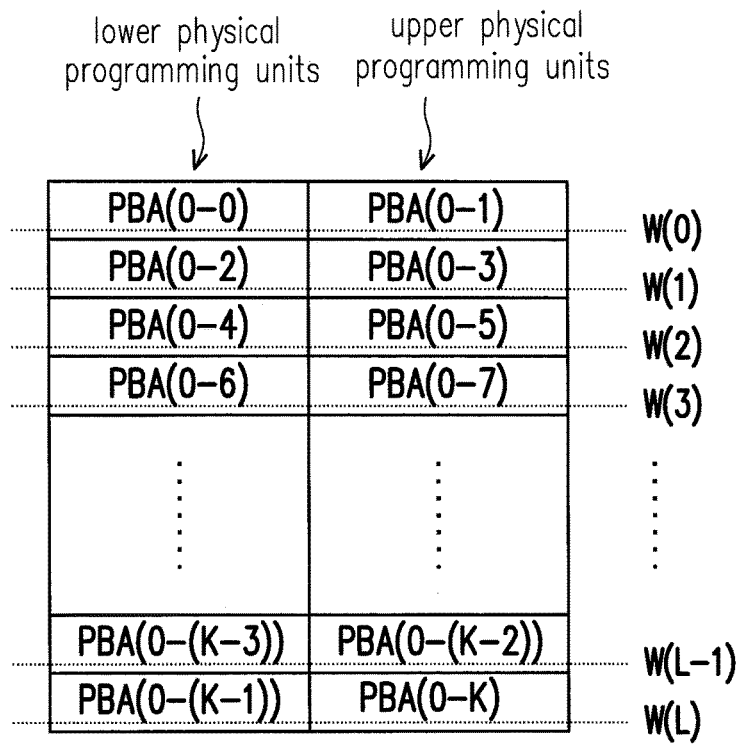
FIG. 17 is a schematic diagram illustrating an arrange sequence of the physical programming units according to another exemplary embodiment.

Referring to FIG. 18, in an example with the arrange sequence of the physical programming units of FIG. 17, if the data D4, D5 and D6 are written from the buffer memory 208 into the empty physical programming units PBA(D-0) to PBA(D-2) in the physical erasing unit 410(D) during the flush operation, the memory control circuit unit 104 (or the memory management circuit 202) only needs to write the dummy data DD being preset in advance into the upper physical programming unit PBA(D-3) corresponding to the lower physical programming unit PBA(D-2).

Figure 19:
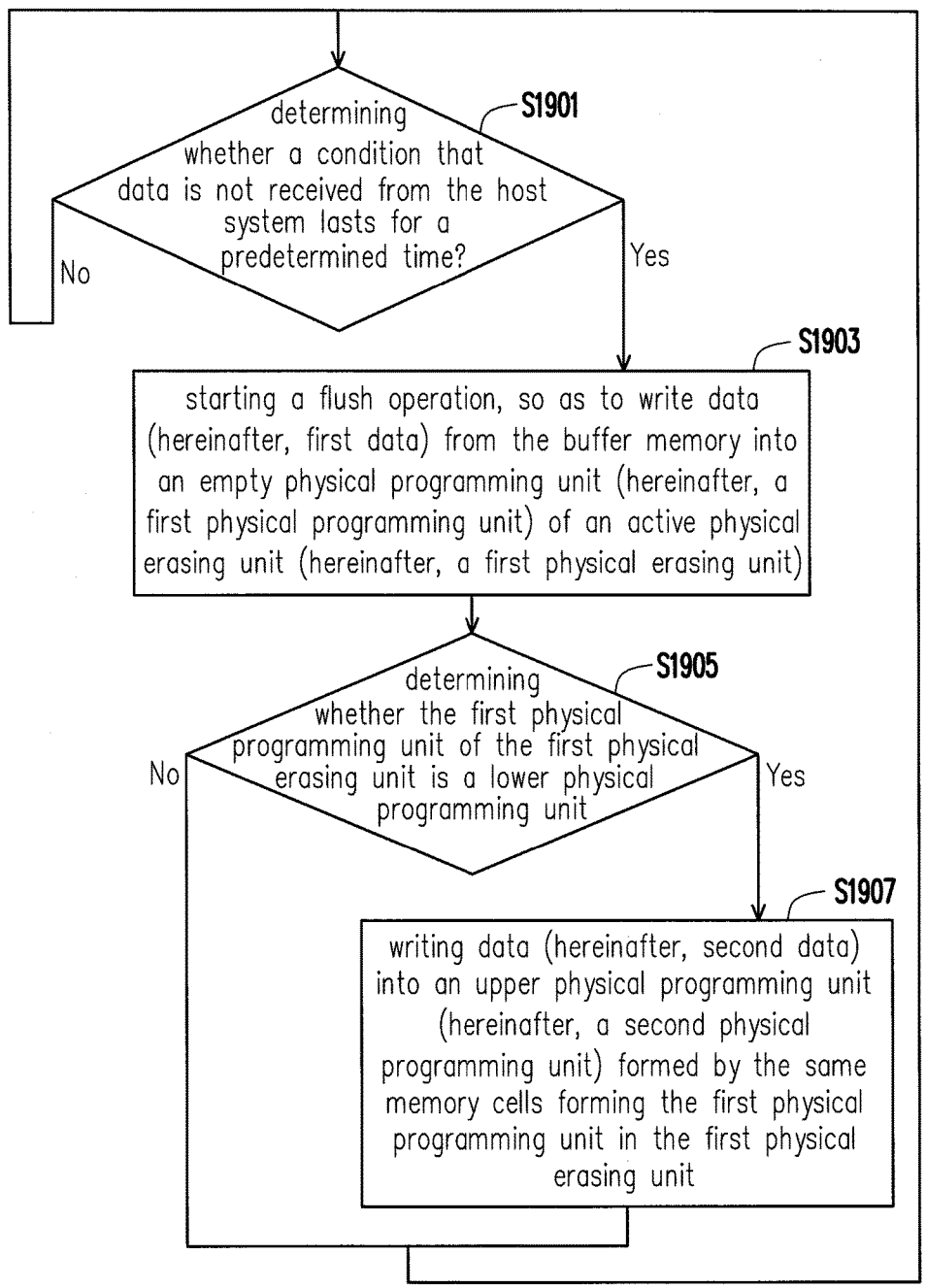
FIG. 19 is a flowchart illustrating a data storing method according to an exemplary embodiment of the present invention.

FIG. 19 is a flowchart illustrating a data storing method according to an exemplary embodiment of the invention.

Referring to FIG. 19, in step S1901, the memory control circuit unit 104 (or the memory management circuit 202) determines whether a condition that data is not received from the host system 1000 lasts for a predetermined time. If not, step S1901 is executed repeatedly.

If the condition that the data is not received from the host system 1000 lasts for the predetermined time is true, in step S1903, the memory control circuit unit 104 (or the memory management circuit 202) starts a flush operation, so as to write data (hereinafter, first data) from the buffer memory 208 into an empty physical programming unit (hereinafter, a first physical programming unit) of an active physical erasing unit (hereinafter, a first physical erasing unit).

Thereafter, in step S1905, the memory control circuit unit 104 (or the memory management circuit 202) determines whether the first physical programming unit of the first physical erasing unit is a lower physical programming unit. If the first physical programming unit of the first physical erasing unit is the lower physical programming unit, in step S1907, the memory control circuit unit 104 (or the memory management circuit 202) writes data (hereinafter, second data) into an upper physical programming unit (hereinafter, a second physical programming unit) formed by the same memory cells forming the first physical programming unit in the first physical erasing unit.

If the first physical programming unit of the first physical erasing unit is not the lower physical programming unit, the flush operation is completed and step S1901 is executed.

It should be noted that, in the flowchart of FIG. 17, after the data is moved from the buffer memory 208 to the rewritable non-volatile memory module 106, the memory control circuit unit 104 (or the memory management circuit 202) may instantly execute the operation of determining whether the physical programming unit for writing the data instructed by the flush operation is the lower physical programming unit, so as to decide whether to execute the operation of writing the data into the upper physical programming unit. However, after the data is moved, it is also possible that the buffer memory 208 again receives new write command and writing data from the host system 1000. Therefore, the memory control circuit unit 104 (or the memory management circuit 202) may write the new writing data into the corresponding lower physical programming unit (i.e., a third physical programming unit of the first physical erasing unit). Accordingly, in another exemplary embodiment of the invention, the memory control circuit unit 104 (or the memory management circuit 202) may start a counter after the data is moved. Then, the memory control circuit unit 104 (or the memory management circuit 202) may execute the operation of determining whether the physical programming unit for writing the data instructed by the flush operation is the lower physical programming unit only after a time counted by the counter exceeds a preset delay time, so as to decide whether to execute the operation of writing the data into the upper physical programming unit. Herein, the preset delay time may be set based on demands, which is not particularly limited in the invention.

It should be understood that, in addition to write the data into the corresponding upper physical programming unit during the flush operation, in another exemplary embodiment, the memory control circuit unit 104 (or the memory management circuit 202) may also write the valid data belonging to one specific logical page into the corresponding upper physical programming unit, thus the data merging operation may be executed at the same time, so as to prevent the physical programming unit from being used meaninglessly.

More specifically, if it is required to write the data into the second physical programming unit corresponding to the first physical programming unit of the first physical erasing unit after the flush operation, the memory control circuit unit 104 (or the memory management circuit 202) may select one physical erasing unit (hereinafter, a second physical erasing unit) among the physical erasing units mapped to the data area 502, copy the valid data in a physical programming unit (hereinafter, a first physical programming unit of the second physical erasing unit) of the second physical erasing unit to the second physical programming unit of the first physical erasing unit, and mark the first physical programming unit of the second physical erasing unit as invalid. Particularly, after the first physical programming unit of the second physical erasing unit is marked as invalid, the second physical erasing unit is no longer stored with the valid data, the memory control circuit unit 104 (or the memory management circuit 202) may directly execute the erasing operation to the second physical erasing unit, and associate the erased second physical erasing unit back to the spare area 504, thus the data merging operation may also be executed at the same time.

Based on above, in the data storing method, the memory control circuit unit and the memory storage apparatus according to the exemplary embodiments, the data are also written into the upper physical programming unit while executing the flush operation and writing said data into the lower physical programming unit, such that the data written into the rewritable non-volatile memory module during the flush operation may be prevented from losing due to programming fail occurred on other physical programming units. In addition, in the data storing method, the memory control circuit unit and the memory storage apparatus according to the exemplary embodiments, the data merging operation is also executed during the flush operation, so as to prevent the physical programming unit from being used meaninglessly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data storing method for storing data in a rewritable non-volatile memory module, wherein the rewritable non-volatile memory module has a plurality of physical erasing units, each of physical erasing units has a plurality of physical programming units comprising a plurality of lower physical programming units and a plurality of upper physical programming units, and the data storing method comprises:

temporarily storing first data into a buffer memory;

starting a flush operation to write the first data from the buffer memory into a plurality of first physical programming units of a first physical erasing unit among the physical erasing units;

generating second data and writing the second data into a plurality of second physical programming units corresponding to the first physical programming units in the first physical erasing unit after identifying that the second physical programming units are not programmed; and deleting the first data from the buffer memory after the second physical programming units are written with the second data, wherein the second physical programming units of the first physical erasing unit belong to the upper physical programming units, and each of the second physical programming units of the first physical erasing unit and one of the first physical programming units of the first physical erasing unit are formed by a plurality of memory cells disposed on a first word line, after writing the first data into the first physical programming units of the first physical erasing unit, starting a counter, wherein the step of identifying that the second physical programming units are not programmed is executed after a value of the counter is greater than a preset delay time.

2. The data storing method of claim 1, further comprising determining whether a condition that data is not received from a host system lasts for a predetermined time, wherein the step of starting the flush operation to write the first data into the first physical programming units of the first physical erasing unit is executed by a background execution mode when the condition that the data is not received from the host system lasts for the predetermined time.

3. The data storing method of claim 1, wherein the second data is a dummy data.

4. The data storing method of claim 1, wherein the step of writing the second data into the second physical programming units of the first physical erasing unit comprises:

copying the second data from a plurality of first physical programming units of a second physical erasing unit among the physical erasing units to the second physical programming units of the first physical erasing unit;

re-mapping a first logical page originally mapped to the first physical programming units of the second physical erasing unit to the second physical programming units of the first physical erasing unit; and marking a status of the first physical programming units of the second physical erasing unit as an invalid state, wherein the second data belongs to valid data of the first logical page.

5. The data storing method of claim 1, further comprising:

receiving third data from the host system, wherein the host system instructs to store the third data into a second logical page;

selecting a third physical erasing unit from the physical erasing units;

determining whether a storage status of the rewritable non-volatile memory module matches a preset status;

if the storage status of the rewritable non-volatile memory module matches the preset status, using a first writing mode to write the third data into a first physical programming unit of the third physical erasing unit, and mapping the second logical page to the first physical programming unit of the third physical erasing unit, wherein in the first writing mode, the lower physical programming units of the third physical erasing unit are used for writing data and the upper physical programming units of the third physical erasing unit are not used for writing data; and if the storage status of the rewritable non-volatile memory module does not match the preset status, using a second writing mode to write the third data into a second physical programming unit of the third physical erasing unit, and mapping the second logical page to the second physical programming unit of the third physical erasing unit, wherein in the second writing mode, the lower physical programming units and the upper physical programming units of the third physical erasing unit are used for writing data.

6. The data storing method of claim 1, further comprising:

before writing the second data into the second physical programming units of the first physical erasing unit, writing the second data into a third physical programming unit of the first physical erasing unit; and after writing the second data into the third physical programming unit of the first physical erasing unit, writing the second data into a fourth physical programming unit of the first physical erasing unit, wherein the third physical programming unit of the first physical erasing unit belongs to one of the upper physical programming units, the third physical programming unit of the first physical erasing unit is formed by a plurality of memory cells disposed on a second word line, and the second word line is adjacent to the first word line, wherein the fourth physical programming unit of the first physical erasing unit belongs to one of the lower physical programming units, the fourth physical programming unit of the first physical erasing unit is formed by a plurality of memory cells disposed on a third word line, and the third word line is adjacent to the first word line.

7. A memory control circuit unit, for controlling a rewritable non-volatile memory module, and the memory control circuit unit comprises:

a host interface configured to couple to a host system;

a memory interface configured to couple to the rewritable non-volatile memory module, wherein the rewritable non-volatile memory module has a plurality of physical erasing units, each of physical erasing units has a plurality of physical programming units comprising a plurality of lower physical programming units and a plurality of upper physical programming units; and a memory management circuit coupled to the host interface and the memory interface, wherein the memory management circuit is configured to temporarily store first data into a buffer memory, wherein the memory management circuit is further configured to start a flush operation to write the first data from the buffer memory into a plurality of first physical programming units of a first physical erasing unit among the physical erasing units, wherein the memory management circuit is further configured to generate second data and write the second data into a plurality of second physical programming units corresponding to the first physical programming units in the first physical erasing unit after identifying that the second physical programming units are not programmed;

wherein the memory management circuit is further configured to delete the first data from the buffer memory after the second physical programming units are written with the second data, wherein the second physical programming units of the first physical erasing unit belong to one of the upper physical programming units, and each of the second physical programming units of the first physical erasing unit and one of the first physical programming units of the first physical erasing unit are formed by a plurality of memory cells disposed on a first word line, wherein after writing the first data into the first physical programming units of the first physical erasing unit, the memory management circuit is further configured to start a counter, wherein the memory management circuit executes the operation of identifying that the second physical programming units are not programmed after a value of the counter is greater than a preset delay time.

8. The memory control circuit unit of claim 7, wherein memory management circuit is further configured to determine whether a condition that data is not received from the host system lasts for a predetermined time, wherein the memory management circuit executes the operation of starting the flush operation to write the first data into the first physical programming units of the first physical erasing unit by a background execution mode when the condition that the data is not received from the host system lasts for the predetermined time.

9. The memory control circuit unit of claim 7, wherein the second data is a dummy data.

10. The memory control circuit unit of claim 7, wherein in the operation of writing the second data into the second physical programming units of the first physical erasing unit, the memory management circuit copies the second data from a first physical programming units of a second physical erasing unit among the physical erasing units to the second physical programming units of the first physical erasing unit, re-maps a first logical page originally mapped to the first physical programming units of the second physical erasing unit to the second physical programming units of the first physical erasing unit, and marks a status of the first physical programming units of the second physical erasing unit as an invalid state, wherein the second data belongs to valid data of the first logical page.

11. The memory control circuit unit of claim 7, wherein the memory management circuit is further configured to receive third data from the host system, wherein the host system instructs to store the third data into a second logical page, wherein the memory management circuit is further configured to select a third physical erasing unit from the physical erasing units, and determine whether a storage status of the rewritable non-volatile memory module matches a preset status, if the storage status of the rewritable non-volatile memory module matches the preset status, the memory management circuit is further configured to use a first writing mode to write the third data into a first physical programming unit of the third physical erasing unit, and map the second logical page to the first physical programming unit of the third physical erasing unit, wherein in the first writing mode, the lower physical programming units of the third physical erasing unit are used for writing data and the upper physical programming units of the third physical erasing unit are not used for writing data; and if the storage status of the rewritable non-volatile memory module does not match the preset status, the memory management circuit is further configured to use a second writing mode to write the third data into a second physical programming unit of the third physical erasing unit, and map the second logical page to the second physical programming unit of the third physical erasing unit, wherein in the second writing mode, the lower physical programming units and the upper physical programming units of the third physical erasing unit are used for writing data.

12. The memory control circuit unit of claim 7, wherein before writing the second data into the second physical programming unit of the first physical erasing unit, the memory management circuit is further configured to write the second data into a third physical programming unit of the first physical erasing unit, wherein the third physical programming unit of the first physical erasing unit belongs to one of the upper physical programming units, the third physical programming unit of the first physical erasing unit is formed by a plurality of memory cells disposed on a second word line, and the second word line is adjacent to the first word line, wherein after writing the second data into the third physical programming unit of the first physical erasing unit, the memory management circuit is further configured to write the second data into a fourth physical programming unit of the first physical erasing unit, wherein the fourth physical programming unit of the first physical erasing unit belongs to one of the lower physical programming units, the fourth physical programming unit of the first physical erasing unit is formed by a plurality of memory cells disposed on a third word line, and the third word line is adjacent to the first word line.

13. A memory storage apparatus, comprising:

a connection interface unit configured to couple to a host system;

a rewritable non-volatile memory module having a plurality of physical erasing units, wherein each of the physical erasing units has a plurality of physical programming units, and the physical programming units comprise a plurality of lower physical programming units and a plurality of upper physical programming units; and a memory control circuit unit coupled to the connection interface unit and the rewritable non-volatile memory module, wherein the memory control circuit unit is configured to temporarily store first data into a buffer memory, wherein the memory control circuit unit is further configured to start a flush operation to write the first data from the buffer memory into a plurality of first physical programming units of a first physical erasing unit among the physical erasing units, wherein the memory control circuit unit is further configured to generate second data and write the second data into a plurality of second physical programming units corresponding the first physical programming units in the first physical erasing unit after identifying that the second physical programming units are not programmed;

wherein the memory control circuit unit is further configured to delete the first data from the buffer memory after the second physical programming units are written with the second;

wherein the second physical programming units of the first physical erasing unit belong to the upper physical programming units, and each of the second physical programming units of the first physical erasing unit and one of the first physical programming units of the first physical erasing unit are formed by a plurality of memory cells disposed on a first word line, wherein after writing the first data into the first physical programming unit of the first physical erasing units, the memory control circuit unit is further configured to start a counter, wherein the memory control circuit unit executes the operation of identifying that the second physical programming units are not programmed after a value of the counter is greater than a preset delay time.

14. The memory storage apparatus of claim 13, wherein the memory control circuit unit is further configured to determine whether a condition that data is not received from the host system lasts for a predetermined time, wherein the memory control circuit unit executes the operation of starting the flush operation to write the first data into the first physical programming units of the first physical erasing unit by a background execution mode when the condition that the data is not received from the host system lasts for the predetermined time.

15. The memory storage apparatus of claim 13, wherein the second data is a dummy data.

16. The memory storage apparatus of claim 13, wherein in the operation of writing the second data into the second physical programming units of the first physical erasing unit, the memory control circuit unit copies the second data from a plurality of first physical programming units of a second physical erasing unit among the physical erasing units to the second physical programming units of the first physical erasing unit, re-maps a first logical page originally mapped to the first physical programming units of the second physical erasing unit to the second physical programming units of the first physical erasing unit, and marks a status of the first physical programming units of the second physical erasing unit as an invalid state, wherein the second data belongs to valid data of the first logical page.

17. The memory storage apparatus of claim 13, wherein the memory control circuit unit is further configured to receive third data from the host system, wherein the host system instructs to store the third data into a second logical page, wherein the memory control circuit unit is further configured to select a third physical erasing unit from the physical erasing units, and determine whether a storage status of the rewritable non-volatile memory module matches a preset status, if the storage status of the rewritable non-volatile memory module matches the preset status, the memory control circuit unit is further configured to use a first writing mode to write the third data into a first physical programming unit of the third physical erasing unit, and map the second logical page to the first physical programming unit of the third physical erasing unit, wherein in the first writing mode, the lower physical programming units of the third physical erasing unit are used for writing data and the upper physical programming units of the third physical erasing unit are not used for writing data; and if the storage status of the rewritable non-volatile memory module does not match the preset status, the memory control circuit unit is further configured to use a second writing mode to write the third data into a second physical programming unit of the third physical erasing unit, and map the second logical page to the second physical programming unit of the third physical erasing unit, wherein in the second writing mode, the lower physical programming units and the upper physical programming units of the third physical erasing unit are used for writing data.

18. The memory storage apparatus of claim 13, wherein before writing the second data into the second physical programming unit of the first physical erasing unit, the memory control circuit unit is further configured to write the second data into a third physical programming unit of the first physical erasing unit, wherein the third physical programming unit of the first physical erasing unit belongs to one of the upper physical programming units, the third physical programming unit of the first physical erasing unit is formed by a plurality of memory cells disposed on a second word line, and the second word line is adjacent to the first word line, wherein after writing the second data into the third physical programming unit of the first physical erasing unit, the memory control circuit unit is further configured to write the second data into a fourth physical programming unit of the first physical erasing unit, wherein the fourth physical programming unit of the first physical erasing unit belongs to one of the lower physical programming units, the fourth physical programming unit of the first physical erasing unit is formed by a plurality of memory cells disposed on a third word line, and the third word line is adjacent to the first word line.

19. The data storing method of claim 1, wherein the second data is generated in a data merging procedure.

20. The memory control circuit unit of claim 7, wherein the second data is generated in a data merging procedure.

21. The memory storage apparatus of claim 13, wherein the second data is generated in a data merging procedure.

* * * * *